United States Patent
Lin et al.

(10) Patent No.: US 6,429,425 B1
(45) Date of Patent: Aug. 6, 2002

(54) METHOD FOR FORMING A CALIBATION STANDARD TO ADJUST A MICRO-BAR OF AN ELECTRON MICROSCOPE

(75) Inventors: Chih-Yung Lin, Hsin-Chu Hsien; Jiunn-Ren Hwang, Tai-Chung, both of (TW)

(73) Assignee: United Microelectronics Corp., Hsin-Chu (TW)

( * ) Notice: Subject to any disclaimer, the term of this patent is extended or adjusted under 35 U.S.C. 154(b) by 0 days.

(21) Appl. No.: 09/340,402

(22) Filed: Jun. 28, 1999

(51) Int. Cl.[7] .......................... G12B 13/00; G01B 21/30
(52) U.S. Cl. ........................ 250/252.1; 250/492.1; 250/307; 250/306; 250/310
(58) Field of Search .................... 250/492.2, 492.24, 250/306, 307, 310, 287, 492.1, 252.1

(56) References Cited

U.S. PATENT DOCUMENTS

| | | | |
|---|---|---|---|
| 4,818,873 A | * 4/1989 | Herriot | 250/310 |
| 5,350,485 A | * 9/1994 | Shiriashi et al. | 156/628 |
| 5,830,611 A | * 11/1998 | Bishop et al. | 430/30 |
| 6,054,713 A | * 4/2000 | Miyake et al. | 250/492.24 |

* cited by examiner

Primary Examiner—John R. Lee
Assistant Examiner—David A. Vanore
(74) Attorney, Agent, or Firm—Winston Hsu

(57) ABSTRACT

The invention relates to a method for adjusting a micro-bar of an electron microscope to increase the accuracy of the micro-bar. The method entails first forming a photo-resist layer on a semiconductor wafer, and exposing a predetermined region of the photo-resist layer to a light of a specific wavelength. Then, a resist stripping process is performed to remove the photo-resist layer in the predetermined region. The periphery of the predetermined region of the photo-resist layer will form a vertical side wall with a periodic wave shape similar to a sine wave, and the wavelength of the periodic wave shape is determined by the wavelength of the light and the refraction rate of the photo-resist layer. Finally, the micro-bar of the electron microscope is adjusted using the wavelength of the periodic wave shape on the vertical side wall.

7 Claims, 3 Drawing Sheets

METHOD FOR FORMING A CALIBATION STANDARD TO ADJUST A MICRO-BAR OF AN ELECTRON MICROSCOPE

BACKGROUND OF THE INVENTION

1. Field of the Invention

The present invention relates to an electron microscope, and more particularly, to a method for adjusting a micro-bar of an electron microscope.

2. Description of the Prior Art

The line width or line space on the semiconductor wafer is less than one μm and cannot be inspected by using an ordinary optical microscope. Therefore, a scanning electron microscope (SEM) must be used. The scanning electron microscope is ideal for performing a non-destructive inspection on a production line to accurately inspect the line widths and line spaces on the semiconductor wafer and ferret out errors occurring during the production process. As a reference, the SEM displays a micro-bar that provides timely calibration during the semiconductor process. As the line width and line space are narrowed, the accuracy of the micro-bar must be increased in order to ensure accuracy of the SEM.

Please refer to FIG. 1. FIG. 1 is a perspective diagram of a method for producing a calibration standard of the micro-bar of a prior art electron microscope. The calibration standard is produced according to the theory of light-interference. To produce the prior art calibration standard, an optical mask 16 is positioned between a light 12 and a semiconductor wafer 10. Two rifts 18 in parallel with each other are positioned on the optical mask 16. A photo-resist layer is positioned on the surface of the semiconductor wafer 10 and the light 12 is used to provide rays 14 with a fixed wavelength that pass through the two rifts 18 of the optical mask 16 to form a plurality of stripes 19 on the photo-resist layer. After exposure, development, and photo-resist stripping are performed, a column structure is formed in the area of each stripe 19. The width of the surface of the column structure is the line space of the stripe 19 and is used as the calibration standard.

When calibrating the micro-bar of a prior art electron microscope, the electron microscope is used to inspect the column structure on the semiconductor wafer 10. The width of the surface of the column structure is the calibration standard making the accuracy of the micro-bar equal to the line space of the stripe 19. The line space of the stripes 19 can be calculated according to the distance between the semiconductor wafer 10 and optical mask 16, the wavelength of the ray 14, the distance between the two rifts 18 and the line space of the stripes 19. The line space of the stripes 19 is in direct proportion to the distance between the semiconductor wafer 10 and optical mask 16 and the wavelength of the ray 14, and is in inverse proportion to the distance between the two rifts 18.

The smallest line space of the stripes 19 using current technology is about 0.24 μm. In other words, the accuracy of the micro-bar after adjustment is 0.24 μm. In 0.1 μm semiconductor processing, the line width and line space on the semiconductor wafer cannot be accurately measured. Also, the prior art method for adjusting the electron microscope requires a special instrument for providing a specific light 12, an optical mask 16 and the appropriate distance from the semiconductor wafer 10 to optical mask 16. Therefore, the prior art calibration standard cannot be produced by an ordinary semiconductor facility.

SUMMARY OF THE INVENTION

It is therefore a primary objective of the present invention to provide a method for adjusting a micro-bar of an electron microscope to solve the above mentioned problems.

Briefly, in a preferred embodiment, the present invention provides a method for adjusting a micro-bar of an electron microscope comprising:

forming a photo-resist layer on a semiconductor wafer;

exposing a predetermined region of the photo-resist layer to a light of a specific wavelength;

performing a resist stripping process to remove the photo-resist layer in the predetermined region wherein the periphery of the predetermined region of the photo-resist layer will form a vertical side wall with a periodic wave shape similar to a sine wave, and the wavelength of the periodic wave shape is determined by the wavelength of the light and the refraction rate of the photo-resist layer; and adjusting the micro-bar of the electron microscope using the wavelength of the periodic wave shape on the vertical side wall.

It is an advantage of the present invention that the method uses the wavelength of the periodic wave shape on the vertical side wall of the column structure to adjust the micro-bar of the electron microscope so as to improve the accuracy of the micro-bar to 0.07 μm~0.06 μm. Therefore, the method can be conveniently used in 0.1 μm semiconductor processing to enable the electron microscope to correctly measure the line width and line space on the semiconductor wafer.

These and other objects and the advantages of the present invention will no doubt become obvious to those of ordinary skill in the art after having read the following detailed description of the preferred embodiment that is illustrated in the various figures and drawings.

DETAILED DESCRIPTION OF THE PREFERRED EMBODIMENT

Figure 1:
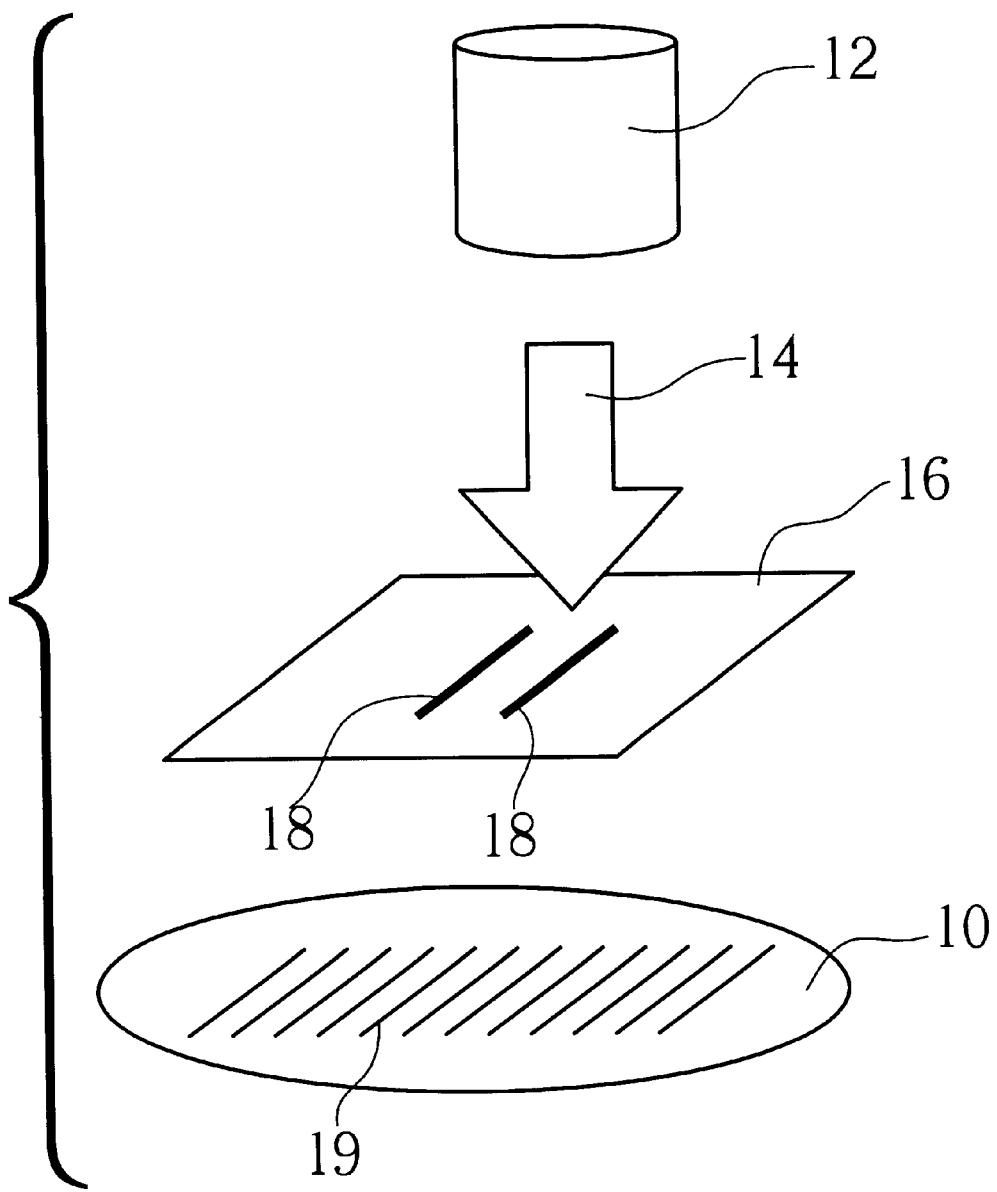
FIG. 1 is a perspective diagram of a method for producing a calibration standard of a micro-bar of a prior art electron microscope.
Figure 2:
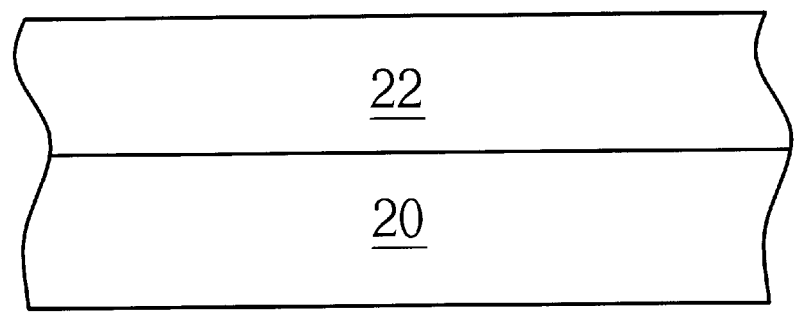
FIG. 2 to FIG. 5 are perspective diagrams of a method for adjusting an electron microscope according to the present invention.
Figure 3:
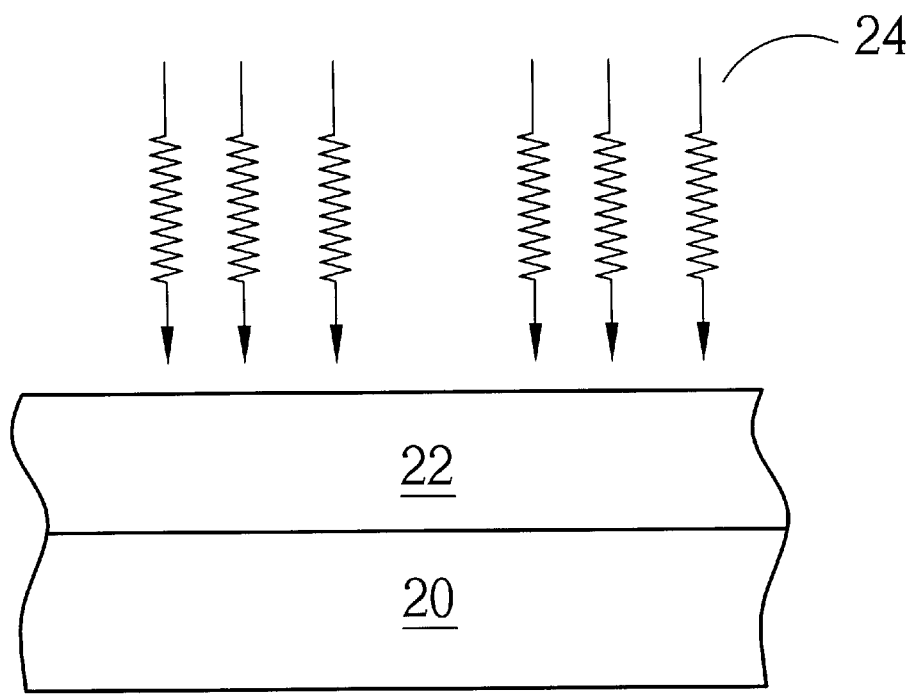

Please refer to FIG. 2 to FIG. 5. FIG. 2 to FIG. 5 are perspective diagrams of a method for adjusting an electron microscope according to the present invention. The method is used for adjusting a micro-bar of an electron microscope which is a scanning electron microscope (SEM) for performing a non-destructive inspection on an in-line. First, a photo-resist layer 22 is formed on the surface of a semiconductor wafer 20, as shown in FIG. 2. Then, a predetermined region on the photo-resist layer 22 is exposed to a deep ultraviolet 24 laser beam with short wavelength generated by KrF (krypton fluoride) or ArF (argon fluoride), as shown in FIG. 3. The arrows in FIG. 3 represent the deep ultraviolet 24 laser beam. The predetermined region of the photo-resist layer 22 surrounds an isolated area of a predetermined shape.

Figure 4:
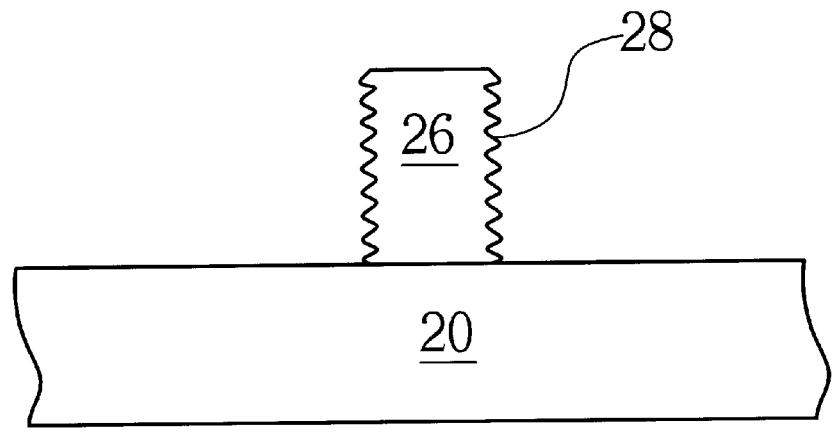
Figure 5:
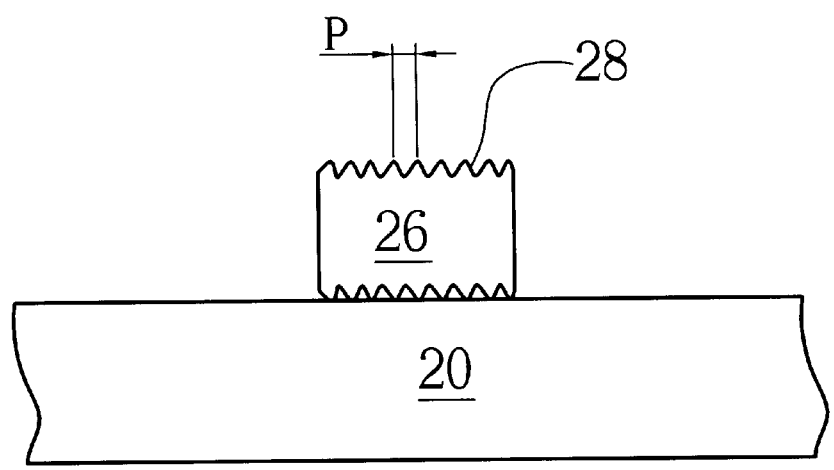

Then, resist developing is performed by using a developer to remove the photo-resist layer 22 in the predetermined region to form a column structure 26, as shown in FIG. 4. During exposure, a part of the light not absorbed by the photo-resist layer 22 will pass through the photo-resist layer 22 and be reflected by the surface of the semiconductor wafer 20 to generate constructive and destructive interference between reflective and incident light-waves. Standing waves are generated to cause uneven exposure of the photo-resist layer 22. Therefore, when performing the resist developing process, the side of the column structure 26 becomes a vertical side wall 28 with a periodic waveform similar in shape to a sine wave. Then, the semiconductor wafer 20 is rotated at high speed to make the column structure 26 fall on the semiconductor wafer 20 after the resist developing process, as shown in FIG. 5.

Direct inspection of the vertical side wall 28 of the column structure 26 is accomplished with the electron microscope using one period of the wavelength of the sine waveform (distance P in FIG. 5) to adjust the micro-bar. The wavelength of the sine wave is determined by the wavelength of the light and the refraction rate of the photo-resist layer 22. The wavelength of the sine wave is calculated by the formula, $P=\lambda/2n$, where $\lambda$ is the wavelength of the light, n is the refraction rate of the photo-resist layer 22, and P is the wavelength of the sine wave.

When exposing the photo resist layer 22 to a KrF laser, the wavelength of the deep ultraviolet 24 is about 2483 Å, and the refraction rate of the photo-resist layer 22 is about 1.78. Therefore, according to the formula, the wavelength of the sine wave is about 0.069 $\mu$m. When exposing the photo resist layer 22 to an ArF laser, the wavelength of the deep ultraviolet 24 light is about 1930 Å, and the refraction rate of the photo-resist layer 22 is about 1.67. Therefore, the wavelength of the sine wave is about 0.057 $\mu$m. The column structure 26 with the vertical side wall in the shape of a sine wave is used as a calibration standard for adjusting the micro-bar of the electron microscope. The accuracy of the adjusted micro-bar is the wavelength of the sine waveform. The accuracy of the micro-bar is 0.07 $\mu$m~0.06 $\mu$m by using the present invention method to adjust the micro-bar of the electron microscope.

Because the wavelength of the periodic wave shape on the vertical side wall of the column structure 26 is determined by the wavelength of the light and the refraction rate of the photo-resist layer 22, the accuracy of the micro-bar is not affected by other instruments. The method according to the present invention needs just one general photolithography source for making the column structure 26 and does not require a special instrument for providing a calibration standard. Therefore, the cost of production is greatly reduced. The method according to the present invention is conveniently used even by an ordinary production facility to produce a column structure 26 for adjusting the micro-bar of the electron microscope.

Compared with the prior art method, the method according to the present invention uses a general photolithography source to expose the photo-resist layer 22 of the semiconductor wafer 20 to a light of a specific wavelength, and performs a resist stripping process to form a column structure 26. A sine waveform is formed on the vertical side wall 28 of the column structure 26. The method uses the wavelength of the periodic wave shape on the vertical side wall 28 of the column structure 26 to adjust the micro-bar of the electron microscope with the accuracy of the micro-bar being 0.07 $\mu$m~0.06 $\mu$m. Therefore, the method can be conveniently used in 0.1 $\mu$m semiconductor processing to enable the electron microscope to correctly measure the line width and line space on the semiconductor wafer.

Those skilled in the art will readily observe that numerous modifications and alterations of the propeller may be made while retaining the teachings of the invention. Accordingly, the above disclosure should be construed as limited only by the metes and bounds of the appended claims.

What is claimed is:

1. A method of forming a calibration standard to adjust a micro-bar of an electron microscope, the method comprising:

forming a photoresist layer on a semiconductor wafer;

exposing a predetermined region of the photoresist layer to a light of a specific wavelength;

performing a resist stripping process to remove portions of the photoresist layer in the predetermined region to make the periphery of the predetermined region of the photoresist layer have a vertical side wall with a periodic wave shape similar to a sine wave, and the wavelength of the periodic wave shape is determined by the wavelength of the light and the refraction rate of the photoresist layer; and using the wavelength of the periodic wave shape on the vertical side wall to be the calibration standard to adjust the micro-bar of the electron microscope.

2. The method of claim 1 wherein the predetermined region surrounds an area of a predetermined shape, and after removing the photoresist layer in the predetermined region, the photoresist layer in the area forms a column structure having a vertical side wall in the periodic wave shape.

3. The method of claim 2 wherein the semiconductor wafer is rotated at high speeds during the resist stripping process and the column structure falls on the semiconductor wafer after the resist stripping process whereby the electron microscope directly uses the periodic wave shape on the vertical side wall of the column structure to adjust its micro-bar.

4. The method of claim 1 wherein the light is a deep ultraviolet ray with a wavelength ranging from 1000 to 3000 angstroms (Å).

5. The method of claim 4 wherein the deep ultraviolet ray is a laser beam created by using KrF (krypton fluoride) or ArF (argon fluoride).

6. The method of claim 1 wherein the resist stripping process uses a developer to remove the photoresist layer in the predetermined region.

7. The method of claim 1 wherein the electron microscope is a scanning electron microscope (SEM) for performing a non-destructive inspection in-line.

* * * * *